(12) United States Patent
Traub

(10) Patent No.: US 7,348,846 B2
(45) Date of Patent: Mar. 25, 2008

(54) AMPLIFIER ARRANGEMENT

(75) Inventor: Johann Traub, Lauingen (DE)

(73) Assignee: Infineon Technologies AG, Munich (DE)

( * ) Notice: Subject to any disclaimer, the term of this patent is extended or adjusted under 35 U.S.C. 154(b) by 610 days.

(21) Appl. No.: 10/916,295

(22) Filed: Aug. 11, 2004

(65) Prior Publication Data
US 2005/0062537 A1 Mar. 24, 2005

(30) Foreign Application Priority Data
Aug. 13, 2003 (DE) ................. 103 37 285

(51) Int. Cl.
*H04B 1/04* (2006.01)
*H04B 7/00* (2006.01)
(52) U.S. Cl. ............... 330/250; 455/127.3; 455/253.2; 455/333; 330/88; 330/98; 330/288
(58) Field of Classification Search ............. 455/226.2, 455/226.4, 253.2, 333, 341; 330/252–261, 330/288–291, 88–89, 98–100; 327/52–54, 327/65–67, 101–103, 127–128
See application file for complete search history.

(56) References Cited

U.S. PATENT DOCUMENTS

| 5,489,868 | A | * | 2/1996 | Gilbert | 327/351 |
| 5,506,537 | A | * | 4/1996 | Kimura | 327/351 |
| 5,677,561 | A | * | 10/1997 | Jensen | 257/469 |
| 6,252,455 | B1 | | 6/2001 | Kurby et al. | |
| 6,313,704 | B1 | * | 11/2001 | Maruyama et al. | 330/259 |
| 6,731,918 | B1 | * | 5/2004 | Kaneki | 455/226.1 |
| 7,010,283 | B2 | * | 3/2006 | Matsumoto et al. | 455/226.1 |
| 2003/0052726 | A1 | * | 3/2003 | Shkap | 327/350 |
| 2003/0067359 | A1 | * | 4/2003 | Darabi et al. | 331/46 |
| 2003/0080805 | A1 | * | 5/2003 | Kaminishi | 327/538 |
| 2004/0038657 | A1 | * | 2/2004 | Bae | 455/226.2 |
| 2005/0037716 | A1 | * | 2/2005 | Mitzlaff | 455/90.3 |

* cited by examiner

*Primary Examiner*—Simon Nguyen
(74) *Attorney, Agent, or Firm*—Eschweiler & Associates, LLC

(57) ABSTRACT

The present invention relates to an amplifier arrangement having a plurality of amplifier stages that form a series circuit. Each amplifier stage comprises a current mirror, the translation ratio of which defines the gain of the amplifier stage. Moreover, a current coupling-out element is provided in each amplifier stage, a partial current being output at said element, and the partial currents are added together in a summation element. An RSSI signal associated with the summed currents is provided at the output of the summation element. The RSSI amplifier arrangement provides constant and thermostable signal amplification, low sensitivity to overvoltages, and exhibits a low current requirement and good radio frequency properties.

16 Claims, 4 Drawing Sheets

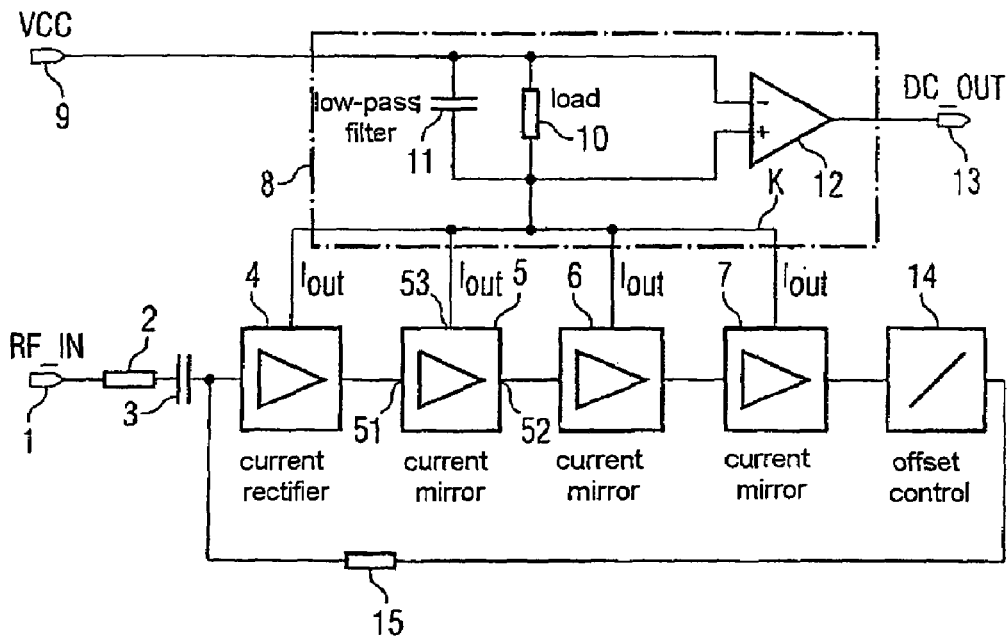
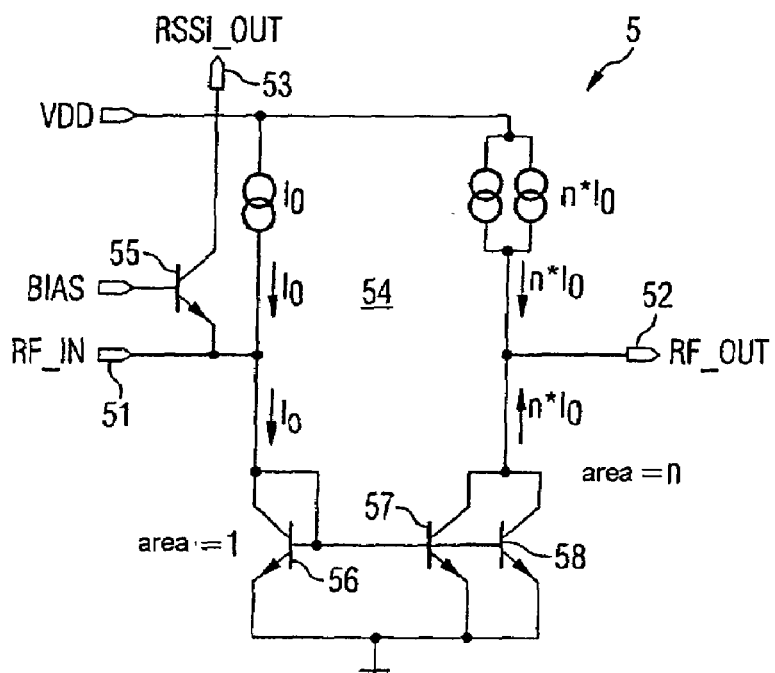

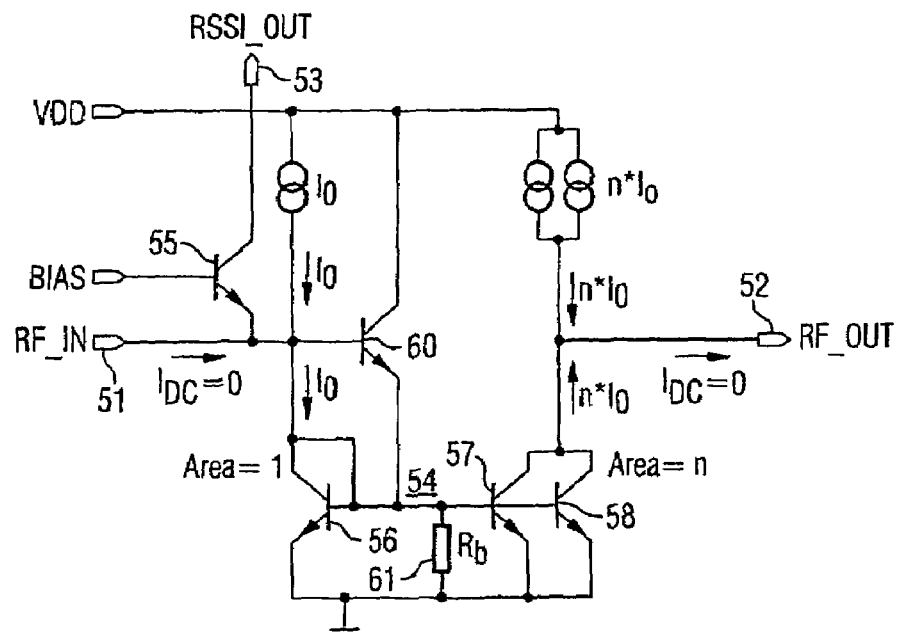
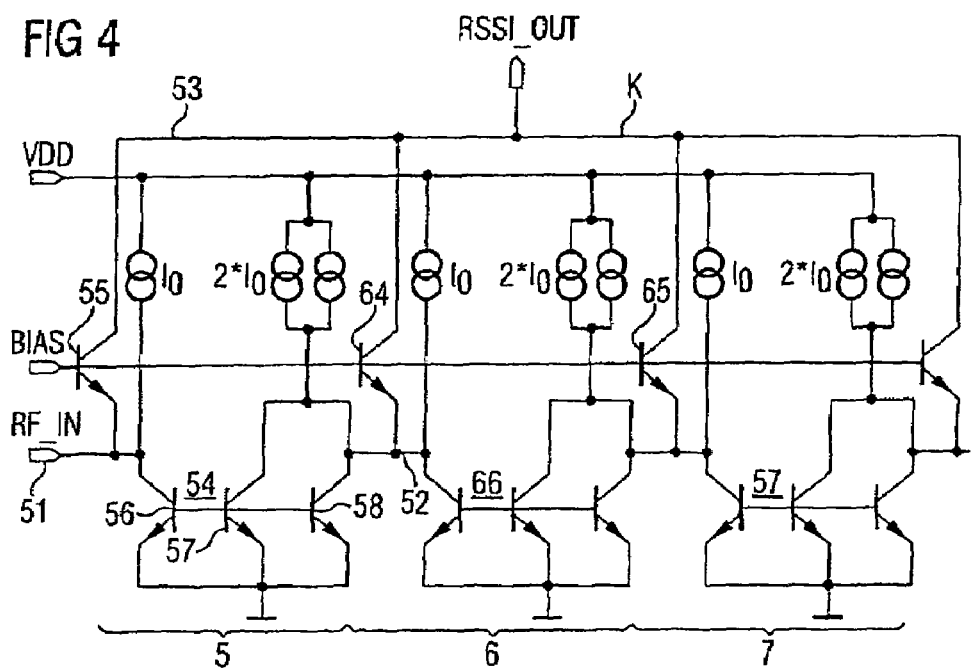

US 7,348,846 B2

AMPLIFIER ARRANGEMENT

REFERENCE TO RELATED APPLICATIONS

This application claims the benefit of the priority date of German application DE 103 37 285.7, filed on Aug. 13, 2003, the contents of which are herein incorporated by reference in their entirety.

FIELD OF THE INVENTION

The present invention relates to an amplifier arrangement, and more particularly to an amplifier arrangement in a receiver associated with a radio frequency communication system.

BACKGROUND OF THE INVENTION

Amplifier arrangements provided in reception circuits in telecommunications technology in the context of radio frequency signal transmission normally have a multistage construction. In this case, it is customary to feed a radio frequency voltage signal into the chain of amplifier stages.

Such a multistage amplifier in a radio frequency receiver is often also concomitantly used to generate a so-called RSSI signal. The RSSI (Receive Signal Strength Indicator) signal represents the power level of the received radio frequency signal at the input of the amplifier.

For this purpose a rectified signal is normally generated at each amplified stage, said signal being present at the emitter node of the differential amplifier of the amplifier stage. The rectified signal is compared with a reference voltage by means of a further differential amplifier in each amplifier stage. The output currents of the second differential amplifier are subtracted from one another and this difference is added to the differences of the further amplifier stages. An RSSI signal is thus provided.

In the unmodulated case, i.e. given an input power of 0, the output currents are all equal and the current difference is 0. Given a maximum input power, all the second differential amplifiers are fully modulated and a maximum current difference results. What is characteristic of such an amplifier with an RSSI output is that the characteristic curve is dB-linear since the output current per gain of an amplifying stage increases by a differential current magnitude of one of the second differential amplifiers.

Furthermore, the known RSSI circuit requires an AC coupling between all the amplifier stages in order to decouple the offsets of the amplifiers, which AC coupling may be realized, for example by means of coupling capacitances between the amplifier stages or in the form of an offset control over the entire chain.

In addition to its high current requirement, what is disadvantageous about the known RSSI circuit is the fact that its temperature response and also manufacturing tolerances are problematic to compensate for and, moreover, the number of amplifier stages exponentiate the resulting error.

A further disadvantage is that the RSSI circuit, owing to the transitions between the amplifier stages, generates a ripple in the characteristic curve, which has to be linearized with additional outlay.

If the RSSI amplifier is intended to be arranged in a power control loop in a radio receiver, it is desirable for there to be a voltage-linear characteristic curve especially in the upper power range, since a particularly high accuracy is required in this range.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to an amplifier arrangement which has an output for providing an RSSI signal, has a low current requirement and, moreover, is substantially insensitive with respect to temperature fluctuations and manufacturing fluctuations.

According to the invention, an amplifier arrangement comprises a plurality of amplifier stages that form an amplifier chain. Each amplifier stage comprises a signal input, a signal output, and a current mirror configured to amplify current, and which couples the signal input to the signal output. Each stage further comprises a current coupling-out element connected to the signal input, and a summation element, to which, on an input side thereof, the current coupling-out elements of the amplifier stages are connected and which, on the output side thereof, provides a signal representing the power level of a radio frequency signal at the input of the amplifier arrangement.

In accordance with one aspect of the invention, each amplifier stage comprise a current mirror which, through suitable dimensioning of the transistors involved, provides the desired gain of the amplifier stage.

In accordance with another aspect of the invention, the signal processing is accordingly effected such that the actual signal information is in each case communicated in the form of currents, rather than in the form of voltages as has been customary hitherto. It is thus possible to dispense with differential amplifiers.

The processing of the signal information in the form of currents rather than in the form of voltages significantly reduces the problem area of overvoltages that possibly occur.

At the amplifier stages, a current component is in each case coupled out by means of a current coupling-element, and these partial currents are summed by a summation element. The summed signal obtained in this way represents the power of a signal present at the input of the amplifier arrangement.

The amplifier arrangement proposed is additionally distinguished by a low power requirement, since only small voltage swings occur. Although the signal information is provided in the form of a current, small voltages are dropped across the effective impedances of the transistors of the current mirrors and the parasitic capacitances. Since these voltages are very small, however, only very little power is required to subject these parasitic capacitances to charge reverse.

An additional advantage of the disclosed amplifier arrangement results from the particularly simple realization using metal-insulator-semiconductor circuit technology, for example, a CMOS circuit.

In accordance with another exemplary aspect of the present invention, all the current mirrors of the amplifier stages have an identical translation ratio between the input current and the output current.

The translation ratio of a current mirror may be determined, for example, by the ratio of the effective transistor area of the output transistor to the effective transistor area of the input transistor. As an alternative, or in addition, it is also possible for a plurality of transistors to be connected in parallel on the output side in order to obtain the desired current gain.

By virtue of the fact that all the amplifier stages have a constant gain ratio or translation ratio, the signal gain is improved further with regard to its constancy and thermostability.

If the input signal of the amplifier arrangement is present as a voltage signal, then a voltage/current converter may preferably be provided at the input of the amplifier arrangement, which converter may be embodied, for example, as a simple series resistor. Consequently, a radio frequency input voltage is converted into a radio frequency current.

As a result of this, the transistors of the amplifier arrangement are protected particularly well from high overvoltages and high input levels.

A current/voltage converter is furthermore preferably provided at the output of the summation element, which converter converts the summed partial currents into a corresponding voltage signal that is, in turn, a measure of the power of a signal present at the input of the amplifier arrangement.

Preferably, a respective resistor of the same type of resistor is used in the case of the voltage/current converter and the current/voltage converter, in order to achieve good pairing properties, that is to say good so-called matching.

The output signal at the output of the summation element can be additionally improved by the connection of a low-pass filter since the output current is at radio frequency.

The input transistors of the current mirrors that are in each case connected up as a diode, and the output transistors of the current mirrors are preferably supplied with current from a current bank in accordance with the current conversion ratio which advantageously results in a high robustness with respect to an oscillation tendency despite a possible asymmetry of the amplified signal relative to ground.

The input of the input-side amplifier stage is preferably connected to the input of the amplifier arrangement via an AC link. As an alternative or in addition, the AC coupling may be realized by means of an offset control on the output of the amplifier arrangement in a feedback path as far as the input of the amplifier arrangement across all the amplifier stages. Such an offset control loop occupies only a small area.

The input stage of the amplifier arrangement is preferably designed as a current rectifier, so that the output signal of the amplifier arrangement is voltage-proportional given a relatively high signal level.

The current coupling-out elements are preferably embodied as so-called clamp transistors that are in each case connected to the input of each amplifier stage. The clamped operation of the transistors of the current coupling-out elements prevents saturation of the current source transistor of the respective current mirror and passes this current concurrently as an output current, that is to say as a partial current for forming the RSSI signal, towards the outside.

The summation element furthermore preferably comprises a resistor network, which couples the current coupling-out elements of the amplifier stages to one another in such a way that the signal provided at the output of the summation element has a linear, in particular voltage-linear, dependence on a power level of a radio frequency signal present at the input of the amplifier arrangement.

The characteristic curve of the disclosed RSSI (received signal strength indicator) circuit thus corresponds to that of an envelope detector with an extended dynamic range. In this case, the output currents are added in binary weighted fashion.

As an alternative, the addition of the partial currents may be formed in any other desired manner, so that the resulting RSSI characteristic curve can be modelled practically as desired.

In particular, it may be advantageous to provide a logarithmic characteristic curve for the lower power range, in order to obtain a large reserve with respect to circuit offsets.

BRIEF DESCRIPTION OF THE DRAWINGS

The invention is explained in more detail below using a plurality of exemplary embodiments with reference to the drawings.

In the figures:

FIG. 1 illustrates a circuit diagram of an exemplary amplifier arrangement in accordance with the present invention, FIG. 2 illustrates a circuit diagram of an exemplary amplifier stage of the circuit of FIG. 1, FIG. 3 illustrates an exemplary alternative embodiment of an amplifier stage of the circuit of FIG. 1 with additional base current amplification, FIG. 4 illustrates a circuit diagram of an exemplary embodiment of an interconnection of a plurality of amplifier stages in accordance with FIG. 2.

DETAILED DESCRIPTION OF THE INVENTION

Figure 5:
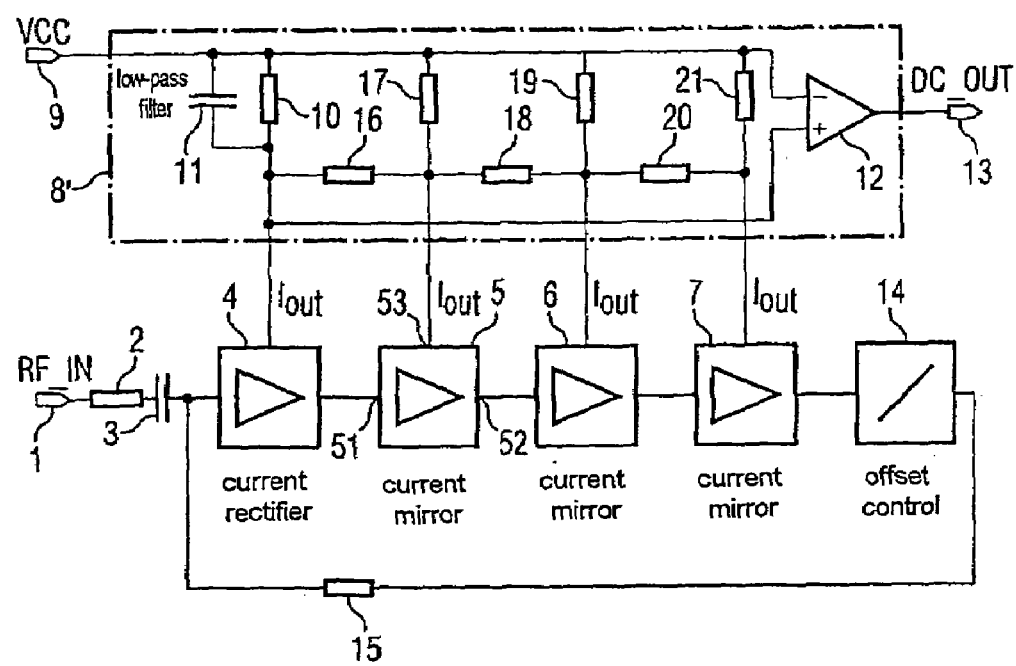
FIG. 5 illustrates an exemplary embodiment of FIG. 1 with a voltage-linear RSSI characteristic curve.

FIG. 1 shows a circuit diagram of an exemplary embodiment of an amplifier arrangement in accordance with the principle proposed, which serves for generating an RSSI, received signal strength indicator, signal. The amplifier arrangement has an input 1 for application of a radio frequency input signal. A series resistor 2 is connected to the input 1, said series resistor serving as a voltage/current converter and converting a radio frequency input signal into a current. For alternating-current coupling, a series capacitor 3 is connected to the series resistor 2, for direct-current decoupling. A total of 4 amplifier stages, bearing the reference symbols 4, 5, 6, 7, are connected to the series capacitor 3 in a series circuit. The input-side amplifier stage 4 is additionally designed as a current rectifier, while all the amplifier stages 4, 5, 6, 7 are embodied with current mirror amplifiers. Each amplifier stage 4, 5, 6, 7 has a signal input and a signal output, the signal input of a stage 5, 6, 7 connected downstream in each case being connected to the signal output of the preceding amplifier stage 4, 5, 6. Furthermore, each amplifier stage 4, 5, 6, 7 has an output at which a partial current $I_{OUT}$ is provided.

All the partial currents of the amplifier stages 4, 5, 6, 7 are combined in a summation element 8. For this purpose, the summation element has a summation node K at which all the current outputs of the amplifier stages 4, 5, 6, 7 are connected. A resistor 10 is connected between a supply potential terminal 9 and the summation node K, said resistor serving as an electrical load and at the same time as a current-voltage converter. A capacitor 11 is connected in parallel with the resistor 10 and effects low-pass filter properties of the summation element 8. The parallel circuit comprising resistor 10 and capacitor 11 is connected between the inverting and noninverting inputs of an operational amplifier 12. The output of the operational amplifier 12 forms the RSSI output 13 of the amplifier arrangement, a signal representing the power level at the radio frequency input 1 being provided at said output. In this case, the RSSI signal at the output 13 is output as a DC voltage signal.

The output of the output-side amplifier stage 7 is coupled via an offset control block 14 and a series resistor 15 to the signal input of the input-side amplifier stage 4 to form a feedback path, for compensation of an offset of the amplifier.

The resistor 2 and the resistor 10 are of the same type of resistor.

The radio frequency input voltage is converted into a radio frequency current by means of the resistor 2. As a result, even at high input levels, no overvoltages can occur at the transistors of the amplifier stages 4 to 7. The amplifier stages 4 to 7 in each case comprise current mirrors with a constant and identical translation ratio between respective input and output currents of the amplifier stage 4, 5, 6, 7. As a result of this, the signal gain of the amplifier arrangement is particularly constant and thermostable.

The input stage 4 acts as a current rectifier in such a way that the output signal of the amplifier arrangement at the output 13 is voltage-proportional in the case of relatively high signal power levels. The output currents of the amplifier stages 4 to 7 are coupled out by means of respective clamping transistors, the saturation of which is prevented by the clamping, and are combined at the node K and converted directly into an output voltage by means of the resistor 10.

Since only small voltage swings occur in the case of the principle proposed, the power requirement of the circuit is low overall. Since the voltage of the amplified signal is small, comparatively little power is necessary to subject parasitic capacitances to charge reversal.

The input transistor that is connected up as a diode and the output transistors of the current mirrors of the amplifier stages 4 to 7 are supplied with current from a current bank in accordance with the current conversion ratio, so that there is a high robustness with respect to an oscillation tendency despite a possible asymmetry of the amplified signal relative to ground.

FIG. 2 shows an exemplary embodiment of the amplifier stage 5 of FIG. 1, which has the same construction as the amplifier stages 6 and 7. The amplifier stage 5 has a radio frequency signal input 51, a radio frequency signal output 52 and also an output terminal 53, at which a partial current signal $I_{OUT}$ for forming the RSSI signal is output. A current mirror 54 is connected between the signal input and the signal output 51, 52, said current mirror having a translation ratio n and having, as input transistor 56, an npn bipolar transistor connected up as a diode and, as output transistor, a plurality of component transistors 57, 58 connected in parallel. All the transistors 56, 57, 58 are respectively connected to one another by their base terminals and emitter terminals. The emitter terminals of the transistors of the current mirror 54 are connected to a reference potential such as ground. A supply potential terminal VDD is connected via a current source I0 to the collector terminal of the diode transistor 56 of the current mirror 54. Equally, the output transistors 57, 58 of the current mirror 54 are arranged in a series circuit comprising a plurality of parallel-connected current sources n*I0, which provide an n-fold current. The signal output 52 is formed at the common collector terminal of the output transistors 57, 58. The output transistors 57, 58 are likewise embodied as npn transistors.

The area ratio of the output transistors 57, 58 to the input transistor 56 of the current mirror 54 determines the translation ratio and thus the current gain. A transistor 55 embodied as an npn bipolar transistor is provided as current coupling-out element. A bias signal can be fed to the base terminal of the transistor 55. The emitter terminal of the transistor 55 is connected to the signal input 51. The collector terminal of the transistor 55 forms the output 53. The transistor 55 is thus connected as a clamped transistor.

FIG. 3 shows a development of the amplifier stage 5 of FIG. 2 in which a base current gain is additionally provided. The circuit of FIG. 3 largely corresponds to the circuit of FIG. 2 in terms of construction and advantageous method of operation. In this respect, the description will not be repeated at this juncture. In the case of the circuit of FIG. 3, a current path is additionally provided between the supply potential terminal VDD and the base terminals of the current mirror transistors 56, 57, 58, which current path comprises a further npn bipolar transistor 60. The base terminal of the bipolar transistor 60 is connected to the radio frequency signal input 51. A base resistor 61 is additionally connected between the base terminals of the current mirror transistors 56, 57, 58 and the reference potential terminal of the current mirror 54. The additional base current gain has the advantage that the AC (alternating current) current gain is increased.

FIG. 4 uses an exemplary embodiment to show the interconnection of a plurality of amplifier stages 5, 6, 7 that in each case have a construction as shown in FIG. 2, as part of an amplifier arrangement as shown in FIG. 1. It can be seen that the translation ratios of the current mirrors 54, 66, 67 of the amplifier stages 5, 6, 7 are in each case of identical design in this example. It furthermore becomes clear that the current sources I0 of the input transistors of the current mirrors 54, 66, 67 are in each case identical, in the same way as the current sources 2×I0 of the output transistors of the current mirrors 54, 66, 67 are likewise identical. The arrangement of the current coupling-out elements 55, 64, 65 is additionally shown, which are respectively arranged at the signal inputs of the amplifier stages 5, 6, 7 and are driven by a common bias signal at their base terminals. The collector terminals of the current coupling-out elements 55, 64, 65 are connected to one another at the summation node K for the formation of an RSSI signal. The interconnection of the amplifier stages shown results in the advantages already explained during the description of FIG. 1.

FIG. 5 shows an alternative embodiment of an amplifier arrangement having a plurality of amplifier stages in accordance with the principle proposed, which is embodied in such a way as to obtain a voltage-linear characteristic curve during the RSSI signal generation. For this purpose, the summation element 8' is correspondingly embodied as a resistor network. The circuit of FIG. 5 largely corresponds to the circuit of FIG. 1 in terms of construction and advantageous method of operation and, in this respect, will not be described again at this juncture.

In contrast to the circuit of FIG. 1, the summation element 8' of FIG. 5 is not embodied such that all the current coupling-out elements of the amplifier stages 4, 5, 6, 7 are connected at a common node K, rather the outputs of the amplifier stages 4, 5, 6, 7, at each of which is provided a partial current $I_{OUT}$ for forming the RSSI signal, are connected to one another in a resistor network. Specifically, the output of the amplifier stage 4 is furthermore connected to a supply potential via a parallel circuit comprising a load resistor 10 and a low-pass filter capacitor 11, the parallel circuit comprising resistor 10 and capacitor 11 being connected to the two inputs of the operational amplifier 12. The output 53 of the amplifier stage 5 is connected to the output of the preceding amplifier stage 4 via a resistor 16 and to supply potential via a resistor 17. The output of the amplifier stage 6 is connected to the output of the preceding amplifier stage 53 via a resistor 18 and to the supply potential terminal 9 via a resistor 19. The output of the amplifier stage 7 is connected to the output of the amplifier stage 6 via a resistor 20 and to the supply potential terminal 9 via a resistor 21.

In the case of the circuit of FIG. 5, the currents that are provided at the current outputs of the amplifier stages 4, 5, 6, 7 in each case as partial current $I_{OUT}$ for forming an RSSI signal are added in weighted fashion, namely with binary weighting. This results in a voltage-linear characteristic curve of the RSSI amplifier. In this case, the voltage signal at the output 13 of the amplifier arrangement of FIG. 5 is related to the power at the radio frequency signal input 1.

Suitable dimensioning of the resistor network 8' makes it possible to set and model the characteristic curve of the amplifier arrangement as desired. In this case, the characteristic curve can be set between voltage-linear and logarithmic. Consequently, it is possible, by way of example, to compensate for properties of characteristic curves of other circuit parts within a control loop. It is thus possible to obtain a constant gain over the modulation range.

Figure 6:
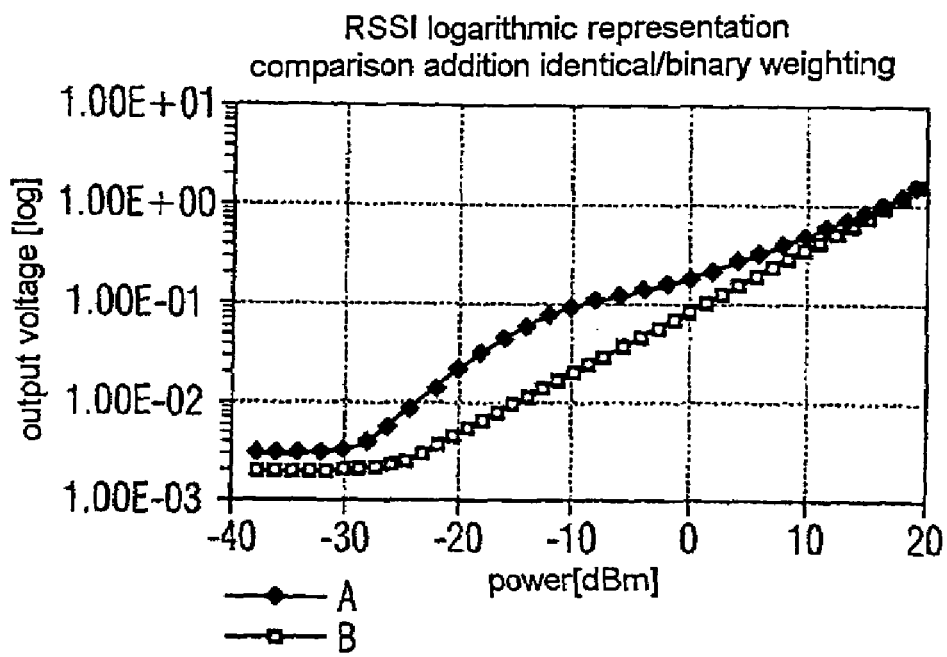
FIG. 6 is a graph illustrating the output voltage of the RSSI signal in a logarithmic representation plotted against the power at the input given an exemplary voltage-linear design.

FIG. 6 shows an exemplary graph of an amplifier arrangement having a plurality of amplifier stages in accordance with the present invention. In this case, in a double logarithmic representation, the output voltage at the output 13 is plotted against the power dBm at the radio frequency input 1. While the characteristic curve A represents a logarithmic RSSI characteristic curve that can be generated by a circuit in accordance with FIG. 1, the characteristic curve B represents the RSSI characteristic curve in a voltage-linear embodiment as is generated by a binary weighting in accordance with the circuit of FIG. 5.

Figure 7:
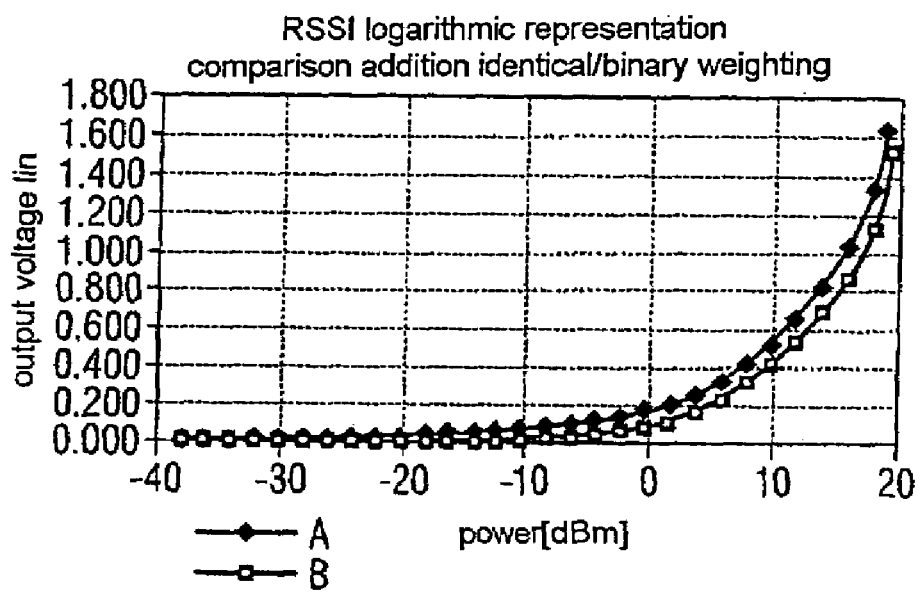
FIG. 7 is a graph illustrating the RSSI characteristic curve with a linear output voltage plotted against an input power specified logarithmically in accordance with another example of the present invention.

FIG. 7 likewise shows a graph of the RSSI characteristic curves in accordance with the principle proposed. In this case, the output voltage at the output 13 is plotted linearly against the power in dBm at the input 1 in a semi-logarithmic representation. In the case of the representation of FIG. 7, too, the characteristic curve A has a logarithmic characteristic curve profile, while the characteristic curve B has a voltage-linear characteristic curve as is generated by means of the circuit in accordance with FIG. 5.

Overall, the graphs in accordance with FIGS. 6 and 7 reveal that a voltage-linear characteristic curve always prevails in the upper power range owing to the current-rectifying effect of the current mirror in the amplifier stage 4 of the circuits of FIGS. 1 and 5 which in each case operates as a current rectifier.

In the lower power range, by contrast, the different additions of the currents in the summation element 8, 8' are manifested, which have been combined firstly in equivalent fashion with a logarithmic characteristic curve and then in binary weighted fashion with a voltage-linear characteristic curve.

As an alternative, the exemplary embodiments described may be realized using metal oxide semiconductor, MOS, circuit technology.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

LIST OF REFERENCE SYMBOLS

1 Radio frequency input
2 Series resistor
3 Series capacitance
4 Amplifier stage
5 Amplifier stage
6 Amplifier stage
7 Amplifier stage
8 Summation element
8' Summation element
9 Supply potential terminal
10 Resistor
11 Capacitor
12 Operational amplifier
13 RSSI output terminal
14 Offset control
15 Resistor
16 Resistor
17 Resistor
18 Resistor
19 Resistor
20 Resistor
21 Resistor
51 Signal input
52 Signal output
53 Current output
54 Current mirror
55 Current coupling-out element
56 Diode
57 Transistor
58 Transistor
60 Transistor
61 Resistor
A db-linear characteristic curve
B Voltage-linear characteristic curve
K Summation node
$I_0$ Current source
$I_{OUT}$ Partial current
N Translation ratio.

The invention claimed is:

1. An amplifier arrangement, comprising:
a plurality of amplifier stages coupled together to form an amplifier chain comprising an amplifier chain input and an amplifier chain output, wherein each amplifier stage further comprises:
  a signal input;
  a signal output;
  a current mirror configured to amplify a current at the signal input, and further configured to couple the amplified current to the signal output; and
  a current coupling-out element connected to the signal input; and
a summation element comprising an input side and an output side, wherein the input side is coupled to the current coupling-out elements of the amplifier stages, and wherein the summation element is configured to provide on the output side a signal representing a power level of a radio frequency signal at the amplifier chain input.

2. The amplifier arrangement as claimed in claim 1, wherein the current mirrors of each respective amplifier stage have an identical translation ratio (n) defined by a ratio of an output current to an input current of the respective current mirror.

3. The amplifier arrangement as claimed in claim 1, further comprising a voltage/current converter coupled to the amplifier chain input and configured to provide a current signal input for the amplifier chain.

4. The amplifier arrangement as claimed in claim 3, wherein the voltage/current converter comprises an input resistor.

5. The amplifier arrangement as claimed in claim 1, further comprising a current/voltage converter coupled to the output side of the summation element and configured to convert a current representing the power level of the radio frequency signal to a voltage.

6. The amplifier arrangement as claimed in claim 5, wherein the current/voltage converter comprises a load resistor.

7. The amplifier arrangement as claimed in claim 1, further comprising a feedback path that couples the amplifier chain output to the amplifier chain input in order to compensate for an offset associated therewith.

8. The amplifier arrangement as claimed in claim 1, wherein the summation element comprises an operational amplifier, which, on the input side of the summation element has a first input terminal coupled to the current coupling-out elements of the amplifier stages and a second input terminal coupled to a supply potential terminal.

9. The amplifier arrangement as claimed in claim 8, wherein the summation element further comprises a low-pass filter coupled to the first and second inputs of the operational amplifier.

10. The amplifier arrangement as claimed in claim 1, wherein the current mirrors of the amplifier stages each comprise bipolar transistor current mirror circuits and a base current gain element.

11. The amplifier arrangement as claimed in claim 1, wherein the summation element further comprises a resistor network that couples the current coupling-out elements of the amplifier stages to one another at the input side thereof in such a way that the signal provided at the output side of the summation element has a linear dependence on the power level of a radio frequency signal at the amplifier chain input.

12. The amplifier arrangement as claimed in claim 1, wherein a first amplifier stage of the plurality of amplifier stages comprises a current rectifier.

13. An amplifier arrangement in a mobile communications receiver, comprising:
a plurality of amplifier stages serially coupled together between an amplifier chain input and an amplifier chain output and configured to receive a radio frequency input signal at the amplifier chain input, wherein each of the plurality of amplifier stages further comprises:
  a current mirror circuit operable to receive an input current at an input of the amplifier stage, amplify the input current, and output the amplified current at an output thereof; and
  a current coupling-out element configured to provide a current associated with the input current of the amplifier stage; and
a summation circuit coupled to the current coupling-out elements of each of the plurality of amplifier stages, and configured to add together the currents of each current coupling-out element, wherein the summed currents represent a power of the radio frequency signal.

14. The amplifier arrangement of claim 13, wherein the current coupling-out element of each amplifier stage comprises a clamp transistor coupled to an input of the current mirror, and configured to prevent saturation of a current source transistor associated with the current mirror, wherein the current provided to the summation circuit is associated therewith.

15. The amplifier arrangement of claim 13, further comprising a voltage to current converter coupled to the amplifier chain input, and configured to convert the radio frequency signal from a voltage to a current for the plurality of amplifier stages.

16. The amplifier arrangement of claim 13, wherein the summation circuit further comprises an operational amplifier configured to generate an output signal indicative of a value of the summed currents.

* * * * *